United States Patent
McKenna

Patent Number: 5,516,125
Date of Patent: May 14, 1996

[54] BAFFLED COLLET FOR VACUUM PICK-UP OF A SEMICONDUCTOR DIE

[75] Inventor: Robert G. McKenna, Houston, Tex.

[73] Assignee: Texas Instruments Incorporated, Dallas, Tex.

[21] Appl. No.: 346,957

[22] Filed: Nov. 30, 1994

[51] Int. Cl.$^6$ ................................................. B25B 11/00
[52] U.S. Cl. ........................ 279/3; 228/44.7; 269/21; 294/64.1
[58] Field of Search .................. 279/3; 228/44.7; 294/64.1; 269/21

[56] References Cited

U.S. PATENT DOCUMENTS

| | | | |
|---|---|---|---|
| 4,588,473 | 5/1986 | Hisatomi et al. | 451/63 |
| 4,903,717 | 2/1990 | Sumnitsch | 269/21 |

FOREIGN PATENT DOCUMENTS

| | | | |
|---|---|---|---|
| 0066148 | 6/1977 | Japan | 294/64.1 |
| 0321171 | 12/1989 | Japan | 279/3 |
| 403242919 | 10/1991 | Japan | 279/3 |
| 405144856 | 6/1993 | Japan | 279/3 |
| 1546086 | 5/1979 | United Kingdom | 294/64.1 |

OTHER PUBLICATIONS

"Vacuum-Operated Greensheet Handler", I. J. DeRobertis et al., IBM Technical Disclosure Bulletin, vol. 24, No. 4 (Sep. 1981).

Primary Examiner—Steven C. Bishop
Attorney, Agent, or Firm—Julie L. Reed; James C. Kesterson; Richard L. Donaldson

[57] ABSTRACT

A vacuum collet (10) for picking up a semiconductor die (11). A plate (12) has a vacuum tube (15) and a downwardly extending skirt (19). Skirt (19) contacts the perimeter of die (11). The vacuum is distributed to the perimeter of the semiconductor die (10) by a baffle (16) interposed between the plate (12) and the die (11) and within the skirt (19).

20 Claims, 3 Drawing Sheets

BAFFLED COLLET FOR VACUUM PICK-UP OF A SEMICONDUCTOR DIE

TECHNICAL FIELD OF THE INVENTION

This invention relates generally to semiconductor processing, and more particularly to a method and apparatus for vacuum pick-up of a semiconductor die.

BACKGROUND OF THE INVENTION

In recent years, semiconductors and semiconductor processing techniques have been used to form "micromechanical" devices. Examples of micromechanical devices are accelerometers, digital micro-mirror devices (DMDs), gears, motors, and pumps, among many other mechanical devices.

In the case of DMDs, for example, an array of hundreds or thousands of tiny tilting mirrors is fabricated. To permit the mirrors to tilt, each is attached to one or more hinges mounted on support posts, and spaced by an air gap over underlying control circuitry. The control circuitry provides electrostatic forces, which cause each mirror to selectively tilt. Examples of DMDs are disclosed in U.S. Pat. No. 4,662,746, entitled "Spatial Light Modulator and Method," herein incorporated by reference.

As the term "micro-mechanical" implies, micro-mechanical devices have tiny mechanical elements that are designed to move. However, these moveable elements are delicate, and care must be taken not to damage them during the manufacturing process. One danger comes from impurities from the air, such as dust, which can settle on the movable elements and inhibit or prevent their movement. Another danger comes from airflow at the surface of these elements, which can cause them to move beyond their breaking point or to be dislodged. Therefore, efforts are made during processing of such devices to control the fabrication environment to reduce air contamination and airflow.

In a typical manufacturing process, micro-mechanical devices and associated circuitry are formed on semiconductor wafers. Copies of the same circuitry are fabricated on different areas of a wafer as "dies". After fabrication is completed, the dies are separated from each other. The dies are then picked up with a vacuum device and transferred to the packaging process.

In existing manufacturing processes, this step of picking up dies with a vacuum has resulted in significant airflow or suction at the face of the die, causing damage to the micro-mechanical elements. To reduce such damage, prior systems have reduced vacuum pressure, which results in less effective pick-up and may even cause some dies to be dropped. Also, attempts have been made to use mechanical "grabbers" to move the dies. Although these mechanical systems reduce airflow, they can be complex and difficult to maintain.

SUMMARY OF THE INVENTION

One aspect of the invention is a vacuum collet for picking-up semiconductor dies. The collet comprises a plate having a vacuum port through which air may be drawn. A skirt extends from the plate for contacting the die around the perimeter of the die. A baffle is interposed between the plate and the die and distributes the vacuum, such that the vacuum draws air substantially from the perimeter of the die.

An advantage of the invention is it permits vacuum pick-up of die having surface topography that can be damaged by airflow. The airflow can be sufficiently high to achieve reliable pick-up because it is distributed to the perimeter of the die rather than to the face of the die. In this way, airflow at the face of the die is reduced or eliminated, thereby avoiding damage to the delicate elements on the die face.

DETAILED DESCRIPTION OF THE INVENTION

Figure 1:
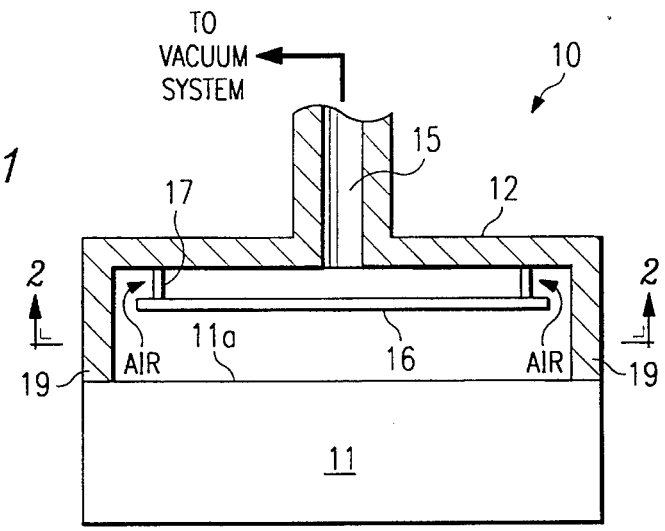
FIG. 1 is a cross-sectional view of one embodiment of a vacuum collet in accordance with the present invention.
Figure 2:
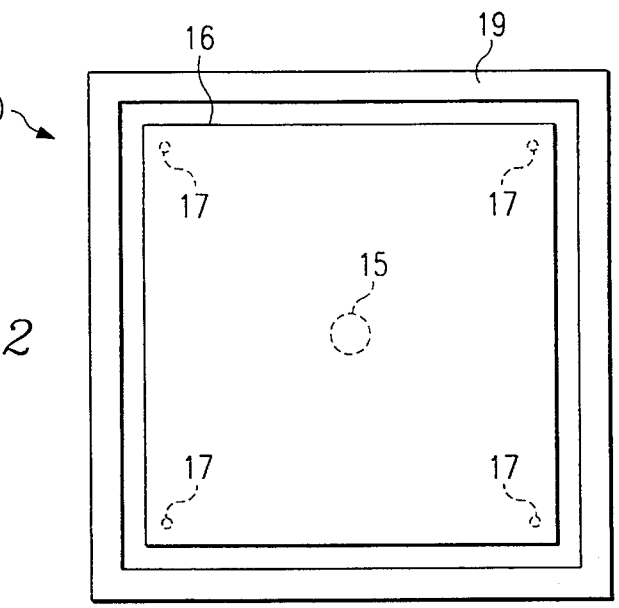
FIG. 2 is a bottom view of the vacuum collet of FIG. 1.

FIGS. 1 and 2 illustrate one embodiment of a vacuum collet 10 for picking-up a semiconductor die 11 in accordance with the invention. By "collet" as used herein means an attachment for the intake of vacuum equipment used for die pickup. More specifically, collet 10 is attached to equipment that provides a vacuum and is controlled in a manner suitable for the semiconductor manufacturing process flow. Typically, collet 10 is controlled to pick-up die 11 and move it to another location for further processing, such as die packaging, or to place it into the die package.

Die 11 has a face 11a, on which some sort of airflow-sensitive elements have been fabricated. An example of a die 11 with this characteristic is a die for a digital micro-mirror device (DMD), which is described above in the Background. In accordance with the invention, collet 10 and its alternative embodiments are designed to avoid damage at the dieface 11a that would otherwise be caused by airflow during pick-up.

Collet 10 comprises a plate 12, a baffle 16, and a skirt 19. Plate 12 has a vacuum port 15. Skirt 19 extends downwardly from plate 12, and together with plate 12, forms a vacuum chamber during operation of collet 10. During operation of collet 10, skirt 19 generally contacts die 10 about its perimeter. To this end, skirt 19 has a shape that generally corresponds to the perimeter of die 11 so as to permit a substantially airtight seal between skirt 19 and die 10.

Baffle 16 is interposed between plate 12 and dieface 11a, within skirt 19. As shown in FIG. 2, baffle 16 has an area slightly smaller than the area within skirt 19. This permits baffle 16 to be spaced from skirt 19 so as to leave a gap between it and skirt 19 through which air may be drawn. Baffle 16 is attached to plate 12 with stand-offs 17.

During operation, collet 10 picks up die 11 through the use of a vacuum that is delivered through vacuum port 15. Baffle 16 protects face a of die 11 from the air flow caused by negative air pressure. Instead of being drawn up from the die face 11a, air will be drawn from the perimeter of die 11, because the air must pass around the baffle 16. In this way, airflow at dieface 11a is significantly reduced or eliminated altogether. Therefore, sensitive elements on dieface 11a are not disturbed or destroyed by airflow.

It should be understood that the embodiment of FIGS. 1 and 2 is illustrative only. The particular location and structure of various elements are exemplary, and other locations and structures can be used without departing from the intended scope of the invention. For example, FIGS. 1 and 2 illustrate baffle 16 being attached to plate 12 with stand-offs 17. The location and shape of the stand-offs 17 may be changed and attachment means other than stand-offs could be used. Furthermore, as discussed below, alternative baffle embodiments may be attached to plate 12 or to skirt 19, or made integral with the plate 12 or skirt 19. Likewise, plate 12 is shown as having a vacuum port 15 through its center. However, it should be understood that this vacuum port 15 may be located elsewhere in plate 12 or in skirt 19. Furthermore, the structure of skirt 19 may be varied as discussed below in connection with FIGS. 5–7.

Figure 3:
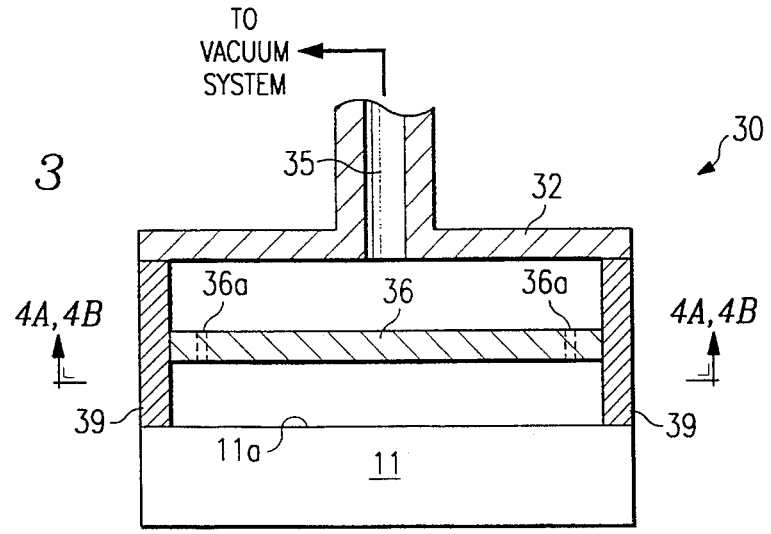
FIG. 3 is a cross-sectional view of another embodiment of the vacuum collet.
Figure 4A:
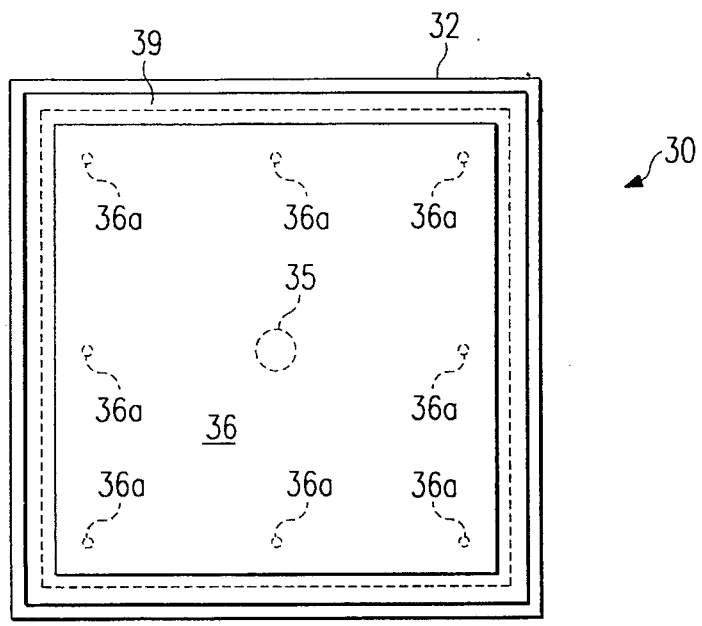
FIGS. 4A and 4B are bottom views of the vacuum collet of FIG. 3.
Figure 4B:
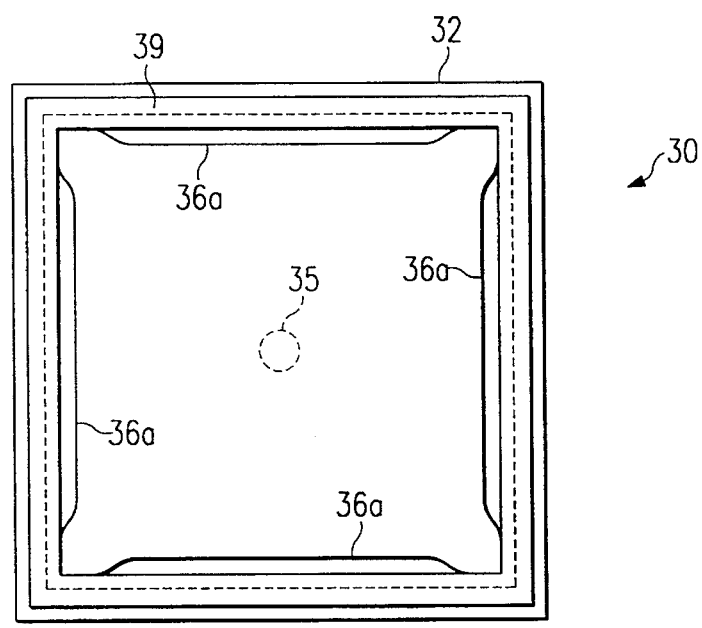

FIGS. 3, 4A, and 4B illustrate an alternative vacuum collet 30. Collet 30 has elements that correspond to the elements of collet 10, being comprised of a plate 32, a skirt 39, and a baffle 36. Like plate 12, plate 32 has a vacuum port 35.

Like baffle 16 of the embodiment of FIGS. 1 and 2, baffle 36 is interposed between plate 32 and the face a of die 11. However, baffle 36 has length and width dimensions that are approximately the same as the area within skirt 39 so that baffle 36 abuts skirt 39 rather than being spaced from it. Baffle 36 has voids 36a for directing the air flow to the perimeter of die 11.

As shown in FIGS. 4A and 4B, the shape and locations of the voids 36a may vary. The voids 36a should be positioned to ensure that airflow at the dieface 11a is minimized during vacuum pick-up. Thus, they are generally distributed so as to correspond to the perimeter of the die 11. The collet 30 contacts the die 11 through the skirt 39 that extends from baffle 36.

The embodiment of FIGS. 3, 4A, and 4B has its plate 32 coupled, through skirt 39, to a separate baffle 36. It should be understood, however, that plate 32 and baffle 36 may be integrally formed. Thus, they may be separate pieces that are coupled together, or they may be a single piece.

The baffles 16 and 36 of collet 10 and of collet 30, respectively, are illustrative only. Other types of baffles for directing the air flow to the perimeter of die 11 may be used without departing from the intended scope herein. The embodiments shown are useful in modifying existing vacuum collets, by adding a baffle. In general, for purposes of this description, a "baffle" is any device positioned within a collet for directing the airflow so that it is substantially from the perimeter of a die in accordance with the invention. By "from the perimeter" is meant that the airflow is directed toward the outer region where the die contacts the collet, as opposed to the inner region on the dieface 11a.

Figure 5:
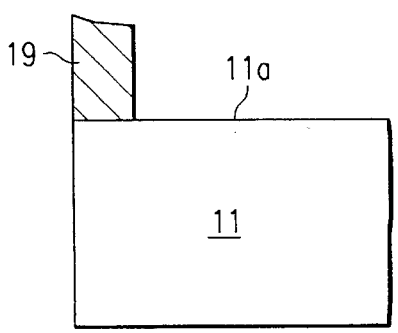
FIGS. 5–7 illustrate various embodiments of the collet's skirt.
Figure 6:
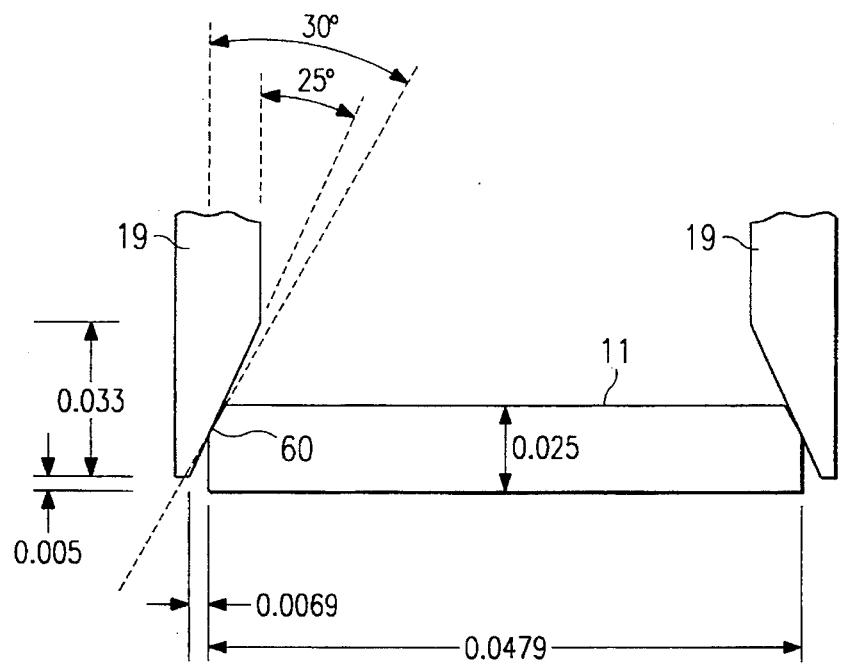
Figure 7:
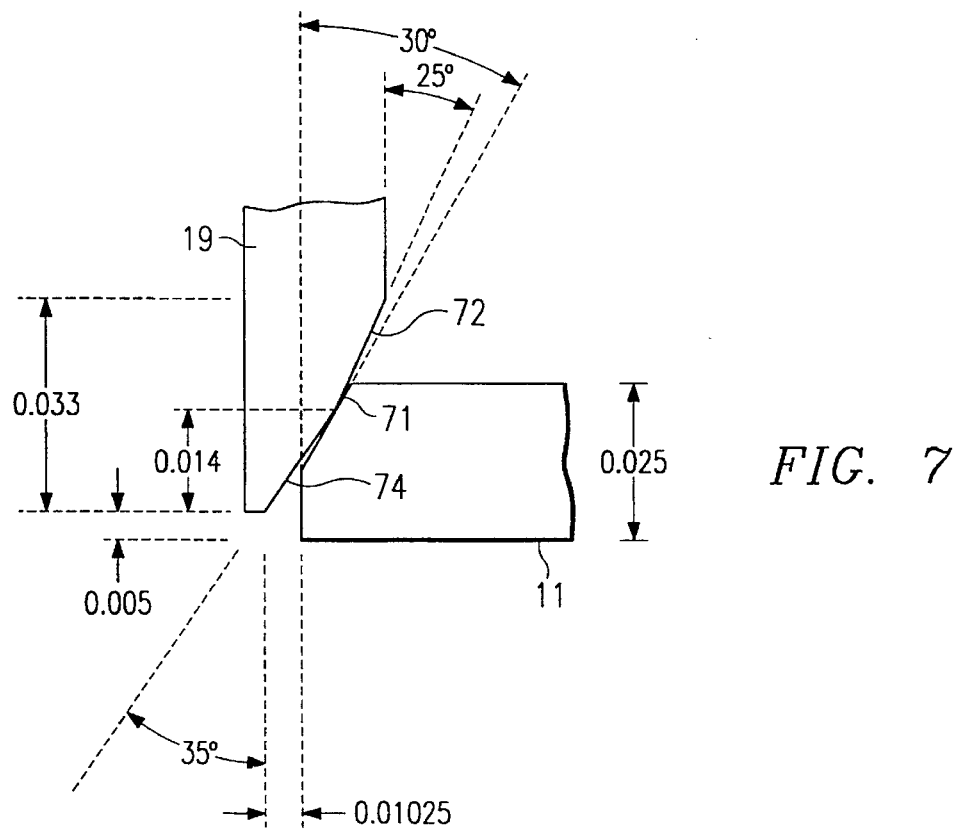

FIGS. 5–7 illustrate alternative embodiments for skirt 19 of collet 10. Although the description is in terms of skirt 19, the same alternative embodiments could be used for skirt 39 of collet 30. As explained above, skirt 19 is the portion of the collet that actually contacts the die 11 to be picked-up. The skirt 19 contacts the die 11 around its perimeter, and is shaped so as to avoid contacting active components on the dieface 11a.

FIG. 5 illustrates a skirt 19 suitable for a die 11 having a flat perimeter on which no semiconductor elements have been formed. Skirt 19 has a flat bottom surface, which contacts die 10 in this flat perimeter.

FIG. 6 illustrates another skirt 19, suitable for a die 11 having a bevelled perimeter. This type of perimeter might exist for various reasons, for example, when a bevelled edge is desirable to minimize chipping of the saw edge. In one type of bevelled edge die, the die boundaries of an entire wafer are partially sawn with a partial v-shaped saw down to a specified depth. The die are subsequently separated by breaking them apart along the saw lines. The angle of the beveled perimeter of die 11 is referred to herein as the "die-perimeter" angle. In the example of this description, the die-perimeter angle is 30 degrees from vertical.

In FIG. 6, the bottom surface of skirt 19 is also angled and is designed to contact the beveled perimeter of die 11. By contacting the beveled perimeter rather than the dieface 11a, any debris that is generated by the contact will be below the dieface 11a and thus will be less likely to cause damage to the die 11.

In the example of FIG. 6, the bottom surface of skirt 19 is designed to contact the beveled perimeter at a point low on the beveled perimeter. This calls for the bottom surface of skirt 19 have an angle less than that of the die-perimeter angle. In the example of FIG. 6, the bottom surface of skirt 19 has an angle of 25 degrees from vertical.

In other embodiments, the bottom surface of skirt 19 might be angled to match that of the die-perimeter angle so as to maximize the area of contact. In this case, for a die-perimeter angle of 30 degrees, the bottom surface of skirt 19 would have an angle of 30 degrees.

FIG. 6 also illustrates some dimensions of a typical collet 10 and die 11. Die 11 is 669 mils by 479 mils. Collet 10 is 683 mils by 493 mils, measured from the outer surface of skirt 19. The skirt 19 extends past the point of contact so that the point of contact is 0.0069 mils inside the inner width of collet 10.

FIG. 7 illustrates a skirt 19 having a bottom surface with compound angles, such that it contacts die 11 at an angle point 71. In other words, the bottom surface of skirt 19 has two faces 72 and 74. Face 72 is at an angle less than that of the die-perimeter angle, whereas face 74 is at an angle greater than that of the die-perimeter angle.

In the example of FIG. 7, the die-perimeter angle is 30 degrees from vertical. Face 72 is at an angle of 25 degrees, with face 74 being at an angle of 35 degrees. Other relevant dimensions for a particular die 11 are shown.

The angles and dimensions of FIGS. 6 and 7 are exemplary only. Thus, for example, the point at which the skirt 19 contacts die 11 may be anywhere along the bevelled perimeter. This may be accomplished by adjusting the dimensions of collet 10 or the lengths or angles of faces 72 and 74.

OTHER EMBODIMENTS

The present invention has been discussed in connection with various embodiments. It should be understood, however, that various substitutions, changes, or alterations can be made to these embodiments without departing from the intended scope of the present invention. Other substitutions, or alterations can be made without departing from the intended scope of the present invention, as defined by the appended claims.

What is claimed is:

1. A vacuum collet for picking-up a semiconductor die, comprising:

a plate having a vacuum port through which a vacuum may be drawn;

a skirt extending from said plate for contacting the semiconductor die at its perimeter on its top surface, such that said skirt does not extend vertically beyond said die; and a baffle interposed between said plate and said die and within said skirt, for directing the airflow of said vacuum such that air is drawn substantially from said perimeter.

2. The collet of claim 1, wherein the said baffle is spaced from said skirt so as to leave an air gap between said baffle and said skirt through which air may be drawn.

3. The collet of claim 1, wherein said baffle abuts said skirt and has voids through which air may be drawn.

4. The collet of claim 1, wherein said perimeter is flat and wherein said skirt has a flat bottom surface for contacting said perimeter.

5. The collet of claim 1, wherein said perimeter is beveled and wherein said skirt has an angled bottom surface for contacting said perimeter.

6. The collet of claim 5, wherein said perimeter is beveled at a die-perimeter angle, and wherein said angled bottom surface has an angle less than or equal to said die-perimeter angle.

7. The collet of claim 1, wherein said perimeter is bevelled, and wherein said skirt has a bottom surface having two angled faces.

8. The collet of claim 7, wherein said perimeter is beveled at a die-perimeter angle, and wherein said bottom surface has a first angled face at an angle less than or equal to said die-perimeter angle and has a second angled face at an angle greater than or equal to said die-perimeter angle.

9. The collet of claim 7, wherein said two angled faces have predetermined angles for contacting said perimeter at an angle point low on said perimeter.

10. A method of picking-up a semiconductor die, comprising the steps of:

drawing a vacuum through a vacuum port of a plate;

contacting the perimeter of said die on its top surface with the bottom surface of a skirt extending from said plate such that said bottom surface does not extend beyond said die; and distributing the vacuum, such that the vacuum draws air substantially from said perimeter of said die.

11. The method of claim 10, wherein said distributing step is performed with a baffle disposed between said plate and said die.

12. The method of claim 11, wherein said baffle is spaced from said skirt so as to permit airflow along the inner surface of said skirt.

13. The method of claim 11, wherein said baffle abuts the inner surface of said skirt, and wherein said baffle has apertures for permitting airflow to said vacuum port.

14. The method of claim 10, wherein said perimeter is flat, and wherein said bottom surface of said skirt is flat.

15. The method of claim 10, wherein said perimeter is beveled, and wherein said bottom surface of said skirt is angled.

16. The method of claim 10, wherein said perimeter is beveled at a die-perimeter angle, and wherein said bottom surface of said skirt is at an angle less than or equal to said die-perimeter angle.

17. The method of claim 10, wherein said perimeter is bevelled, and wherein said bottom surface of said skirt has two angled faces.

18. The method of claim 10, wherein said perimeter is beveled at a die-perimeter angle, and wherein said bottom surface of said skirt has a first angled face at an angle less than or equal to said die-perimeter angle and has a second angled face greater than or equal to said die-perimeter angle.

19. A method of picking-up a semiconductor die, comprising the steps of:

beveling the perimeter of said die;

drawing a vacuum through a vacuum port of a plate;

contacting the perimeter of said die on its top surface with the bottom surface of a skirt extending from said plate such that said bottom surface of said skirt does not extend beyond said die, said bottom surface being angled; and distributing the vacuum, such that the vacuum draws air substantially from said perimeter of said die.

20. The method of claim 19, wherein said beveling step results in a die-perimeter angle, and wherein said contacting step is performed with said bottom surface being angled at an angle less than or equal to said die-perimeter angle.

* * * * *